United States Patent
Cromarty et al.

(10) Patent No.: US 10,555,430 B2
(45) Date of Patent: *Feb. 4, 2020

(54) ELECTRONICS ENCLOSURE SYSTEMS AND METHODS

(71) Applicant: Heathkit Company, Inc., Santa Cruz, CA (US)

(72) Inventors: Andrew S. Cromarty, Palo Alto, CA (US); Jacob H. Neugass, Santa Cruz, CA (US); Jasen Levoy, Santa Cruz, CA (US)

(73) Assignee: HEATHKIT COMPANY, INC., Santa Cruz, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,892

(22) Filed: Feb. 25, 2019

(65) Prior Publication Data

US 2019/0191583 A1 Jun. 20, 2019

Related U.S. Application Data

(63) Continuation of application No. 15/282,314, filed on Sep. 30, 2016, now Pat. No. 10,219,398, which is a continuation-in-part of application No. 29/539,973, filed on Sep. 18, 2015, now abandoned.

(60) Provisional application No. 62/236,423, filed on Oct. 2, 2015.

(51) Int. Cl.
| | |
|---|---|
| *A47B 96/04* | (2006.01) |
| *H05K 7/14* | (2006.01) |
| *H05K 5/00* | (2006.01) |
| *H05K 5/02* | (2006.01) |

(52) U.S. Cl.
CPC ......... *H05K 7/1407* (2013.01); *H05K 5/0008* (2013.01); *H05K 5/0234* (2013.01)

(58) Field of Classification Search
CPC ...................................................... G06F 1/181
USPC ... 312/334.6, 334.7, 334.14, 334.27, 334.29, 312/334.31, 334.32, 334.3, 4, 334.36
See application file for complete search history.

(56) References Cited

U.S. PATENT DOCUMENTS

| | | |
|---|---|---|
| 1,467,311 A | 9/1923 | Elliott |
| 4,007,563 A | 2/1977 | Nakagawa |
| 4,041,358 A | 8/1977 | Donahue et al. |
| 4,626,617 A | 12/1986 | Rye |
| 4,759,341 A | 7/1988 | McFarland |
| 4,802,716 A | 2/1989 | Rock et al. |
| 4,938,472 A | 7/1990 | Gould et al. |
| 5,014,115 A | 5/1991 | Moser |
| 5,230,554 A | 7/1993 | Camilleri |
| 5,364,180 A | 11/1994 | Berger |
| 5,911,521 A | 6/1999 | Steinmetz et al. |
| 5,958,525 A | 9/1999 | Green et al. |
| 5,971,350 A | 10/1999 | McCutcheon |
| 5,992,957 A | 11/1999 | Ecker et al. |
| 6,122,164 A | 9/2000 | Liao et al. |
| 6,659,293 B1 | 12/2003 | Smith |
| 6,969,133 B2 | 11/2005 | Compagnucci |

(Continued)

*Primary Examiner* — Matthew W Ing
(74) *Attorney, Agent, or Firm* — Squire Patton Boggs (US) LLP

(57) ABSTRACT

An enclosure assembly for electronic equipment using a housing and a sled. The sled is a combination of a bracket with a skid, the skid preferably of a low friction material, where the sled slides into the housing in order to complete the assembly.

20 Claims, 6 Drawing Sheets

(56) References Cited

U.S. PATENT DOCUMENTS

| | | |
|---|---|---|
| D613,725 S | 4/2010 | Chen |
| D616,412 S | 5/2010 | Garrett |
| D672,330 S | 12/2012 | Komagamine |
| 8,485,568 B2 | 7/2013 | Sung |
| D743,927 S | 11/2015 | Endo et al. |
| D747,109 S | 1/2016 | Shay-Puetzer et al. |
| D751,831 S | 3/2016 | Shay-Puetzer et al. |
| D773,430 S | 12/2016 | Holzer |
| D792,367 S | 7/2017 | Nishida |
| 2016/0040922 A1* | 2/2016 | Ha ................ F25D 23/006 312/404 |

* cited by examiner

ELECTRONICS ENCLOSURE SYSTEMS AND METHODS

CROSS-REFERENCE TO RELATED APPLICATIONS

This application is a continuation of U.S. patent application Ser. No. 15/282,314, filed on Sep. 30, 2016, which claims priority to U.S. Provisional Patent Application No. 62/236,423, filed on Oct. 2, 2015, and which is a continuation-in-part of U.S. Design patent Ser. No. 29/539,973, filed on Sep. 18, 2015, all of which are hereby incorporated by reference in their entireties.

FIELD OF THE INVENTION

The present invention generally relates to the field of mechanical enclosures for electronic equipment, and apparatus that attaches to electronic equipment.

BACKGROUND

Electronics systems typically are enclosed in a protective enclosure. The enclosure may variously protect the electronics from physical damage, protect users of the equipment from unintended interaction with the electronics such as capacitive coupling or electrical shock, reduce or eliminate unintended electromagnetic transmissions to and from the electronics, and physically stabilize the electronics to reduce or eliminate undesired coupling between mechanical and electronic subsystems.

Designing enclosures that provide for these characteristics but also permit ease of access when needed is challenging. Access may be desired for study and analysis of the electronics, for diagnosis and repair of the electronics, or even to permit viewing the internal construction for aesthetic reasons. Generally the operational characteristics of the enclosure that make it most effective for the above purposes also thwart easy access to the internals. For example, stabilizing the enclosure or making it "radio frequency-tight" may entail use of tight-fitting mechanical components, multiple hardware fasteners, and/or complex assembly and disassembly. This tradeoff usually is weighted in favor of the operational characteristics of the enclosure; for example, many modern cell phones or computers are exceedingly difficult to open or require special uncommon tools to disassemble. This tradeoff is acceptable where the manufacturer intends that the equipment contains no user-serviceable parts or subsystems inside.

A special problem arises when the enclosure is to be used for educational or pedagogical purposes, such as an electronics kit. Ideally, it is desirable to stabilize the kit in an open as well as closed condition so the electronics can be viewed, diagnosed, learned or taught, or repaired by the owner. Such systems have the atypical requirement that the parts inside are expressly intended to be user-serviceable; indeed they may have been assembled by the user.

There is therefore a need for an enclosure apparatus, and methods of manufacturing it, that facilitates stability of the internal electronic components and provides for ease of user access in an opened condition, and which can be easily opened and closed by its user or owner with simple or no special tools.

Performance of such a system may be further enhanced if the enclosure can be opened and closed a very large number of times, far more than is common for apparatus with no user-serviceable parts inside, without significant friction or wear and with a high degree of reliability in the placement of the electronics subsystems when the enclosure is reassembled to its closed condition, to achieve a high-quality aesthetic and functional "fit and finish" of the resulting product.

BRIEF DESCRIPTION OF THE DRAWINGS

The headings provided herein are for convenience only and do not necessarily affect the scope or meaning of the claimed invention. In the drawings, the same reference numbers and any acronyms identify elements or acts with the same or similar structure or functionality for ease of understanding and convenience. To easily identify the discussion of any particular element or act, the most significant digit or digits in a reference number refer to the Figure number in which that element is first introduced (e.g., element 403 is first introduced and discussed with respect to FIG. 4).

DETAILED DESCRIPTION

Figure 1:
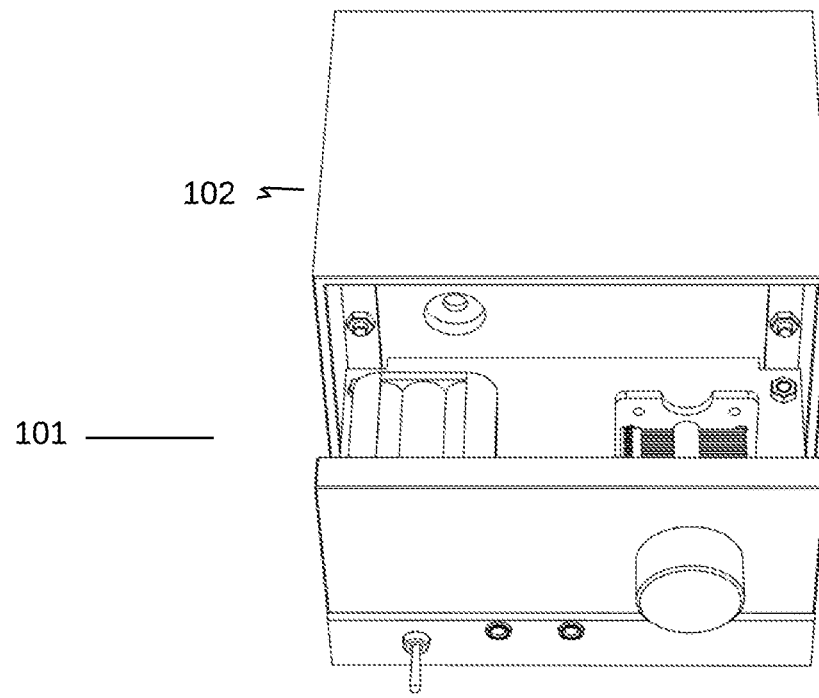
FIG. 1. A drawing of an exemplary enclosure system from the front and above, with the internal sled bearing the electronics partially removed from the external case in a stable fixed configuration.
Figure 2:
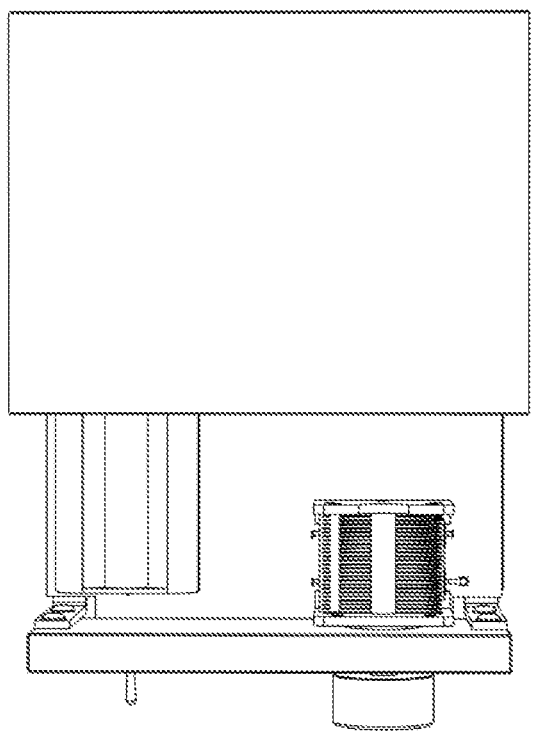
FIG. 2. A drawing of the exemplary enclosure system from the top, with the internal sled bearing the electronics partially removed from the external case in a stable fixed configuration.
Figure 3:
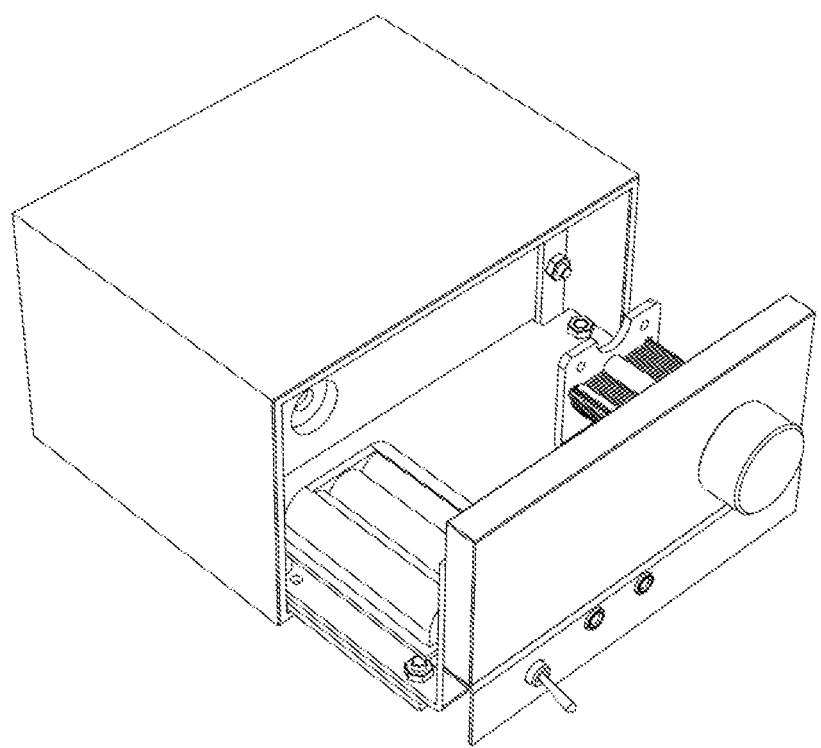
FIG. 3. A drawing of the exemplary enclosure system from above and to the left in a trimetric perspective view, with the internal sled bearing the electronics partially removed from the external case in a stable fixed configuration.

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other features not described in detail herein. Additionally, some well-known structures or functions may not be shown or described in detail below, so as to avoid unnecessarily obscuring the relevant description. The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

The invention of an enclosure assembly is disclosed comprising in one embodiment:

a sled comprising at least two bracket components and two corresponding skid components, said skid components and said bracket components comprised of one or a plurality of holes;

one or a plurality of enclosure fasteners having an attachment mechanism;

said holes of the skid components and bracket components each adapted to accept one of the attachment mechanisms of a corresponding one of the enclosure fasteners;

a housing comprised of a floor where said sled fits partially or wholly within said housing, said housing comprised of a plurality of holes in the floor adapted to permit the attachment mechanism of the enclosure fasteners to pass through; and said skid component situated so as to reside between the bracket component and the floor of the housing when the sled is partially or fully inserted into the housing.

In another embodiment, the sled fits partially or wholly within said housing in either a closed configuration or partially open configuration with respect to the case or housing, and in either configuration is substantially stable.

In yet another embodiment, the fastener is a rubber footing that may be threaded and the holes may be adapted to accept the threaded foot or fastener hardware by being large enough in diameter to permit passage of the foot threaded component or fastener. In another embodiment, the holes may be adapted to accept the threaded foot or fastener hardware by being tapped with threads so as to permit the foot or fastener to screw into the hole. In yet another embodiment, the threaded foot or fastener may pass through one component and screw into the other, such as for example by passing through the skid and screwing securely into the bracket.

In another embodiment, the skid comprises a material with a low coefficient of friction, such as a self-lubricating or low-friction plastic in contact with the case or housing as the sled is removed from and inserted into the case or housing. The sled also may be in partial or full contact with the case or housing in the fully closed configuration. In one embodiment, screws or other hardware may fasten or bind the skid and bracket sled components together. In another embodiment, the skid and sled components may be bound or fastened together by the threaded foot or fastener that also passes through the case or housing.

In another embodiment, the sled is attached to one or a plurality of front panel components comprising the front of the enclosure, using screws or other fasteners. In another embodiment, the sled is attached to one or a plurality of rear panel components comprising the rear of the enclosure, using screws or other fasteners. In one embodiment, a plurality of coplanar or nearly-coplanar front panel components are themselves attached to each other with screws. Said coplanar or nearly coplanar front panel components may be made of differing materials. In one embodiment, said differing materials are metal and wood.

In one embodiment, the holes through which the fasteners pass or into which they are threaded are countersunk. For example, FIG. 5 depicts countersunk holes 510 (unnumbered countersunk screws filling those holes 510) in a plastic skid 520 which is part of sled 501. This offers the advantage of minimizing or eliminating friction by presenting only the plastic surface, and no metal fastener hardware, to the adjacent case or housing surface as the sled is moved repeatedly in and out of the case or housing. FIG. 5 also shows corresponding holes 514, in the housing 502, into which multiple feet 402 of FIG. 4 would be inserted. FIG. 5 further shows a hole 512 in the plastic skid 520, and a corresponding hole 516 in the housing 502, through which fastener 403 would be inserted.

In one embodiment, one panel of the case is transparent or translucent to permit and facilitate inspection of the electronics and other components within the case or housing including when the assembly is in either the open or the closed configuration.

In one embodiment, the sled is positioned or attached so as to sit along the side or outer edges of the electronics. This sled position offers the advantage of minimizing obstruction of view and facilitates effective assembly, modification, diagnosis, and repair of the electronics subassembly.

In a preferred embodiment, the electronics is suspended above the lowest part of the sled in contact with the housing using standoffs or spacers. This offers the advantage of facilitating easy access to the electronics components without disassembly, stabilizing the electronics in both the open and closed configurations, and presenting the electronics for inspection or manipulation.

In a preferred embodiment, the stable partially opened configuration is at the mathematically determinate location that maximizes the removal of the sled from the case or housing without causing the center of mass of the opened sled to tip the assembly over when positioned on a flat level surface. This maximum point can be established by positioning said holes in the sled to extend and cantilever the sled as far as possible out of the case or housing while retaining the center of mass over, or within the geometric area circumscribed by, the feet under the case or housing.

In one embodiment, the position of the sled relative to the case or housing in the stable partially-open configuration exposes only those electronics components or subassemblies that are safe for user access while keeping other components or subassemblies contained within the case or housing.

Turning to FIG. 1, the sled (101) is shown in an expanded picture with the sled locked in position in the partially-open configuration, that is, partly out of the housing (102). The nearly-coplanar wood and metal front panel components attached to the sled also are depicted.

Figure 4:
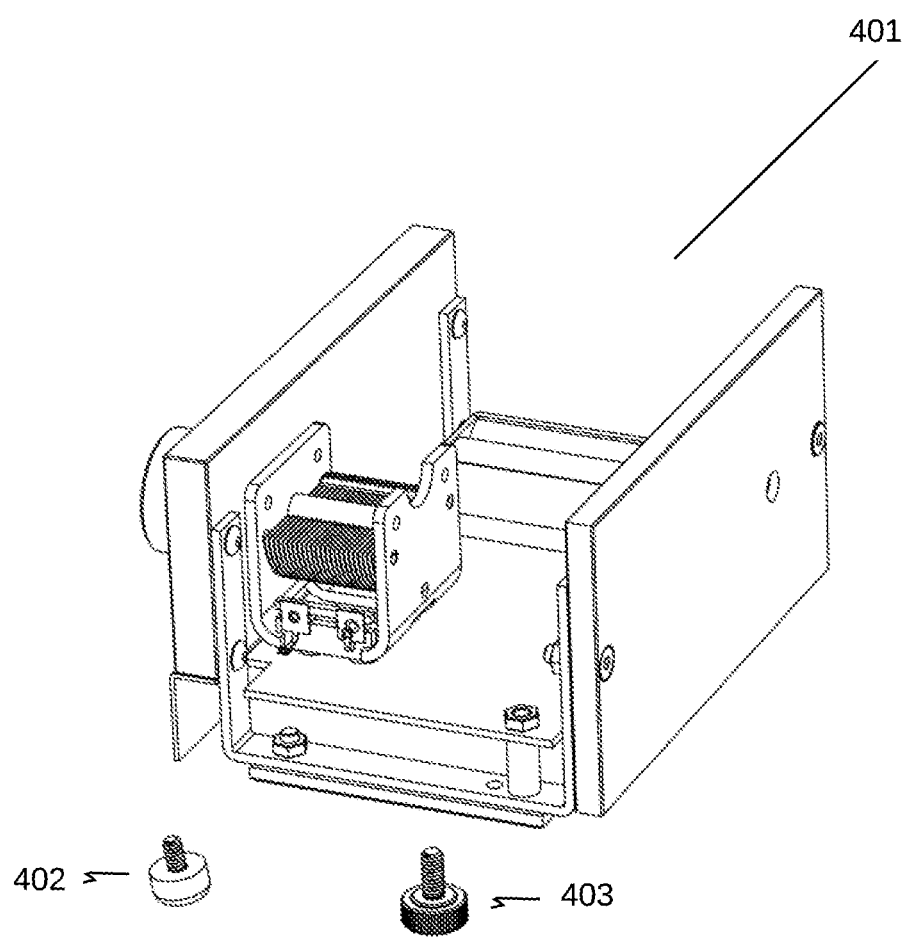
FIG. 4. A drawing of the exemplary enclosure system with the internal sled bearing the electronics removed from the external case, in a right view.
Figure 5:
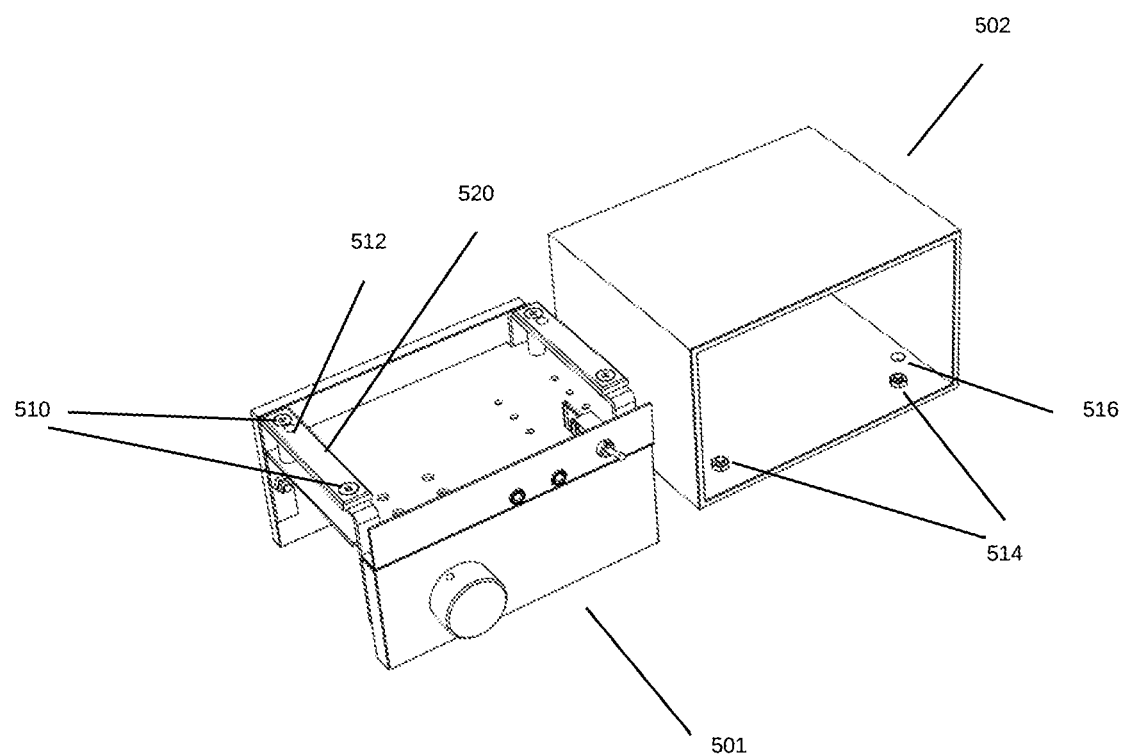
FIG. 5. A drawing of the exemplary enclosure system from the bottom, showing the skid.

In FIG. 4, the sled (401) and its attached electronics have been removed from the case or housing, and an exemplary foot (402) and fastener (403) are depicted. In a preferred embodiment, the fastener may be a threaded thumbscrew. In one embodiment, the foot may contain a captive threaded stock component. In another embodiment, the foot may contain a captive screw or a removable screw.

Figure 6:
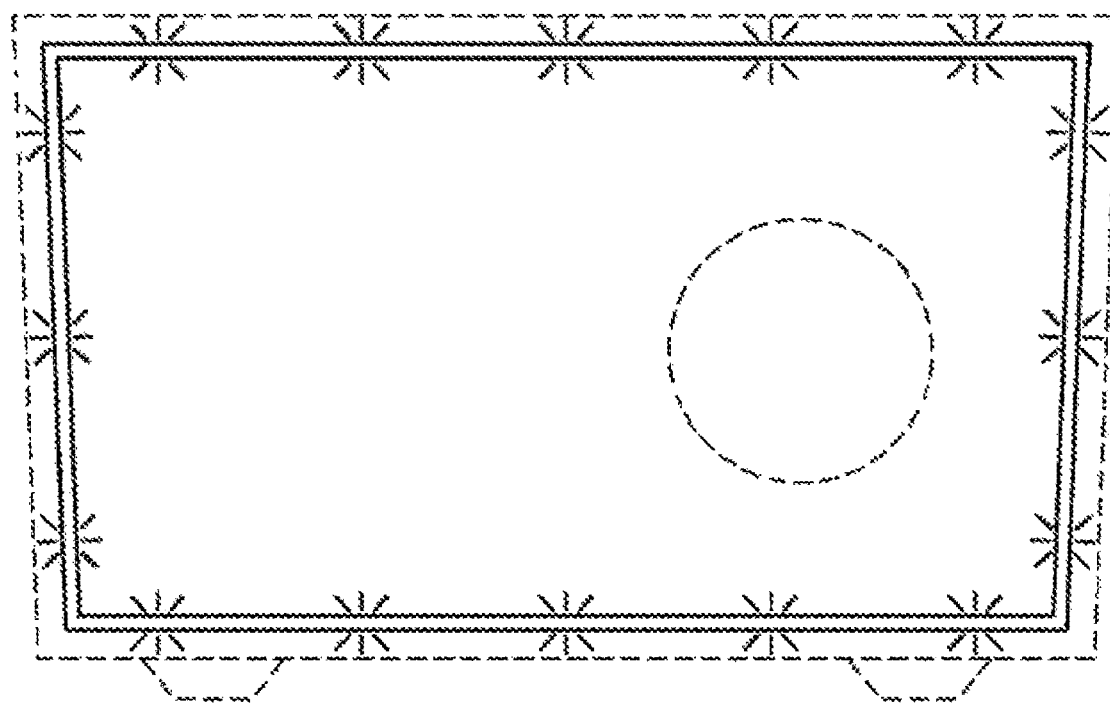
FIG. 6. A drawing of the exemplary front panel appearance when the sled is inserted into the housing.

In another embodiment, housing surface planarity and hole location tolerances in sled and bracket are determined so as to be sufficiently small to permit the coplanar or nearly-coplanar front panel surfaces attached to the bracket's 90 degree extensions to be precisely centered within the area of the front of the housing when the sled is inserted into the housing. See FIG. 6. In one embodiment the thickness of the sled component, the sine of the angle of incidence of the approximately perpendicular extension, the compression under attachment and the density of the plastic sled component, and the precise position of the sled attachment points to the housing floor are positioned to precisely locate the front panel within the space of the front of the housing enclosure, when the sled is inserted. In this position, the plane of the front panel is approximately flush with the edge of the housing when the sled is inserted into the housing and the fasteners attached to bind the sled to the housing through the holes. In another embodiment, the thickness of the sled component, the sine of the angle of incidence of the approximately perpendicular extension, the compression under attachment and the density of the plastic skid component, and the position of the sled attachment points to the cabinet may be empirically determined through measurement so as to precisely locate the front panel within the space of the front of the housing enclosure. The manufacturing tolerance of each such determinative aspect of panel positioning is then replicably applied during manufacturing of the components to achieve a centered, or other desired, precise positioning of the front panel within the housing when the sled is inserted into the housing and the fasteners attached to bind the sled to the housing using the holes. In a similar manner, the positioning relative to the cabinet of all other panels, such as side, top, bottom, or back panels, may be accomplished.

The described embodiments of the invention are intended to be exemplary and numerous variations and modifications will be apparent to those skilled in the art. All such variations and modifications are intended to be within the scope of the present invention as defined in the appended claims. Although the present invention has been described and illustrated in detail, it is to be clearly understood that the same is by way of illustration and example only, and is not to be taken by way of limitation. It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable combination. It is appreciated that the particular embodiment described in the Appendices is intended only to provide an extremely detailed disclosure of the present invention and is not intended to be limiting.

What is claimed is:

1. An electronics enclosure assembly providing a protective enclosure for electronics, the enclosure assembly comprising:
    a sled comprising at least two bracket components and two corresponding skid components, said skid components and said bracket components comprised of one or a plurality of holes;
    one or a plurality of enclosure fasteners having an attachment mechanism;
    said holes of the skid components and bracket components each adapted to accept one of the attachment mechanisms of a corresponding one of the enclosure fasteners;
    a housing comprising a floor, said floor having one or a plurality of holes adapted to permit the attachment mechanism of each of the one or a plurality of enclosure fasteners to pass through, said housing further comprising at least one panel that is sufficiently transparent or translucent to facilitate inspection of electronics and other components within the enclosure assembly when the sled is partially or fully inserted into the housing; and
    said skid component situated so as to reside between the bracket component and the floor of the housing when the sled is partially or fully inserted into the housing.

2. The enclosure assembly of claim 1 wherein the at least one panel is a front panel of the housing.

3. The enclosure assembly of claim 1 wherein the at least one panel is a rear panel of the housing.

4. The enclosure assembly of claim 1 wherein the sled configurable to be attached and positioned relative to the electronics so as to enable viewing of the electronics within the housing.

5. The enclosure assembly of claim 1 wherein the sled is configurable to be attached and positioned relative to the electronics so as to enable modification of the electronics within the housing.

6. The enclosure assembly of claim 1 wherein the enclosure assembly has a partially-open attached configuration wherein, in the partially-open attached configuration, a position of the sled relative to the housing exposes only those components that are safe for user access while keeping other components contained within the housing.

7. The enclosure assembly of claim 1 comprising a plurality of fasteners, each of the plurality of fasteners comprising a rubber footing.

8. The enclosure assembly of claim 7 wherein, for each said rubber footing, the attachment mechanism passes through the hole in the skid component and is secured by the bracket component.

9. The enclosure assembly of claim 1 wherein each said attachment mechanism comprises a threaded component and the holes in the bracket components are threaded to permit the threaded fastener to screw into the hole.

10. The enclosure assembly of claim 1 where the skid component comprises a material with a low coefficient of friction.

11. The enclosure assembly of claim 1 where the skid component comprises a self-lubricating or low-friction plastic.

12. The enclosure assembly of claim 1 wherein the fastener mechanism passes through the holes in the housing to fasten the skid component and the bracket component together.

13. The enclosure assembly of claim 1 where each one of the two bracket and skid pairs are located proximate to a corresponding first and second sides of the housing when the sled is inserted into the housing.

14. The enclosure assembly of claim 1 where the two bracket components are shaped to each have at least one extension that is about 90 degrees from the plane of the bracket and skid combination.

15. The enclosure assembly of claim 14 where the at least one extension has holes formed therein, the holes adapted to fasten a front or back panel to the housing to complete the enclosure when the sled is inserted into the housing.

16. The enclosure assembly of claim 1 where at least one first fastener attaches one of the skids to one of the brackets, said one fastener extending past the bracket to fasten a circuit card to the bracket and a second fastener attaches the sled to the floor of the housing by passing through a hole in the floor and a corresponding hole in the skid and attaching to the bracket.

17. The enclosure assembly of claim 16 where the skid component is comprised of a material with a low coefficient of friction.

18. The enclosure assembly of claim 1 where said holes in the sled are positioned to cantilever the sled as far as possible out of the housing while retaining the center of mass within the geometric area circumscribed by housing.

19. The enclosure assembly of claim 1 wherein a housing surface planarity and a plurality of locations corresponding to the plurality of holes in the sled component and bracket component each have tolerances that are sufficiently small to permit a panel surface attached to the about 90 degree bracket extensions to be sufficiently precisely and reliably centered within the front of the housing when the sled is repeatedly inserted into the housing and the fasteners attached to bind the sled to the housing through the holes so that light appears uniformly around the panel surface when the sled is inserted into the housing.

20. A method of precision manufacturing an electronic enclosure comprising a housing and a panel precisely positioned within an area of the housing when a sled having a plastic component of known density to which said panel is attached by at least one bracket having an approximately perpendicular extension is inserted into the housing, the method comprising:
- determining a thickness of the sled;
- determining a sine of an angle of incidence of the approximately perpendicular bracket extension;
- configuring an amount of compression applied to the sled to be attached to the enclosure;
- determining precise locations of attachment points of the sled to a floor of the housing, and locating holes at those attachment points in the housing, so that fasteners attached to the sled bind the sled to the housing through the holes at the attachment points;
- determining tolerances for the enclosure and attachment points to maintain the panel centered within the housing when the sled is inserted into the housing; and
- repeatably locating the attachment points and determining the tolerances during manufacturing to permit precise positioning of the panel relative to the housing.

* * * * *